United States Patent [19]

Sugihara

[11] 4,417,310

[45] Nov. 22, 1983

[54] APPARATUS FOR MEASURING DISTORTION FACTOR

[75] Inventor: Kiyoyuki Sugihara, Tokorozawa, Japan

[73] Assignee: Shibasoku Company Limited, Tokyo, Japan

[21] Appl. No.: 244,560

[22] Filed: Mar. 17, 1981

[30] Foreign Application Priority Data

Mar. 29, 1980 [JP] Japan ................................. 55-40815
Apr. 15, 1980 [JP] Japan ................................. 55-49783

[51] Int. Cl.³ ........................ H04B 3/46; G06F 15/20
[52] U.S. Cl. ............................... 364/481; 324/57 DE
[58] Field of Search .............. 364/481, 484, 485, 487; 179/175.3 R, 175; 324/77 A, 57 DE

[56] References Cited

U.S. PATENT DOCUMENTS

| | | | |
|---|---|---|---|
| 3,842,247 | 10/1974 | Anderson | 364/481 |
| 4,093,989 | 6/1978 | Flink et al. | 364/485 |
| 4,124,818 | 11/1978 | Lin et al. | 364/481 |
| 4,125,809 | 11/1978 | Mott | 364/481 |
| 4,264,959 | 4/1981 | Blaass | 364/487 |
| 4,275,446 | 6/1981 | Blaass | 364/487 |
| 4,301,536 | 11/1981 | Favin et al. | 364/481 X |

Primary Examiner—Edward J. Wise
Attorney, Agent, or Firm—Lawrence I. Field

[57] ABSTRACT

An apparatus for measuring a distortion factor of an analog input signal comprises a frequency multiplier for producing a sampling signal having a frequency of the input signal multiplied by N, an analog to digital converter for successively converting instantaneous values of the input signal into digital values, a memory circuit for storing the converted digital values at given address positions in the memory circuit, a digital to analog converter for reading out the digital values stored in the memory circuit in a correct phase sequence at a given reading-out frequency and converting read-out digital values into analog values, a filter tuned to a frequency equal to the reading-out frequency divided by N and filtering out a fundamental component of the input signal, and a level meter for measuring a level of an output signal supplied from the filter. The distortion factor is calculated from a measured level of the output signal from the filter and a level of the fundamental component.

29 Claims, 23 Drawing Figures

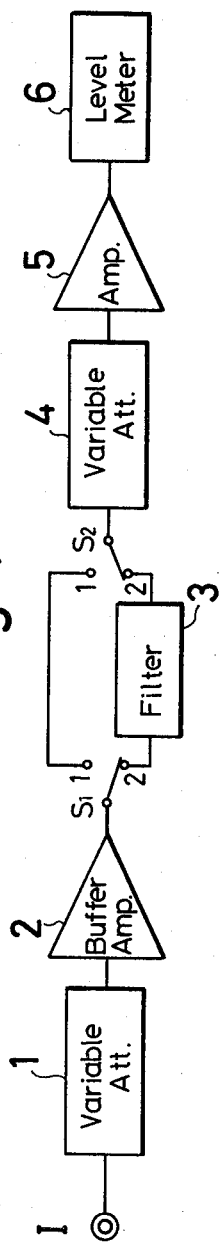
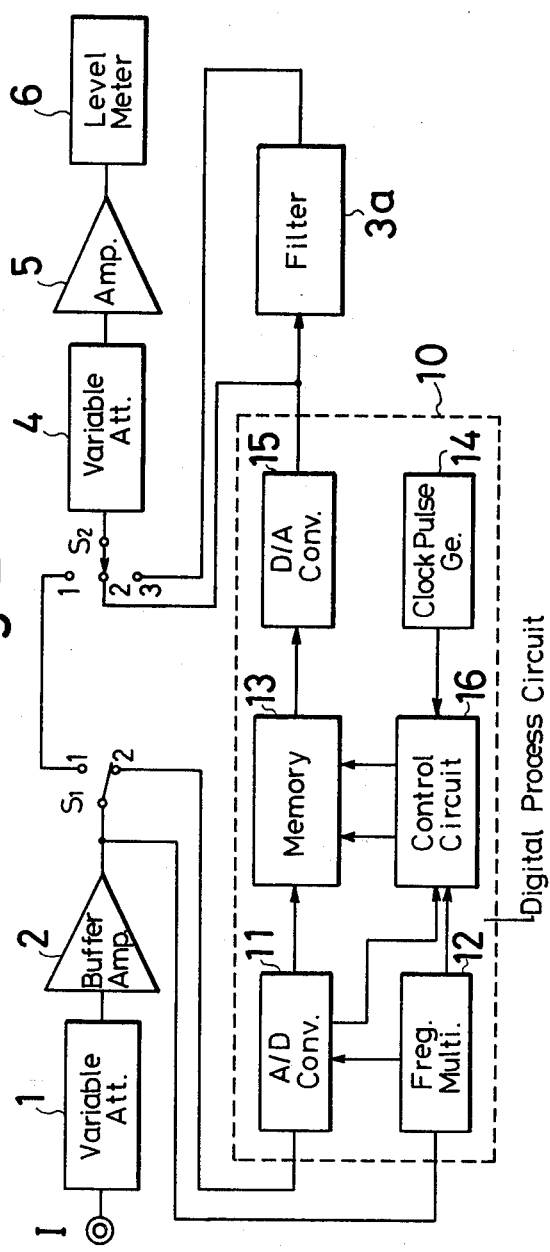

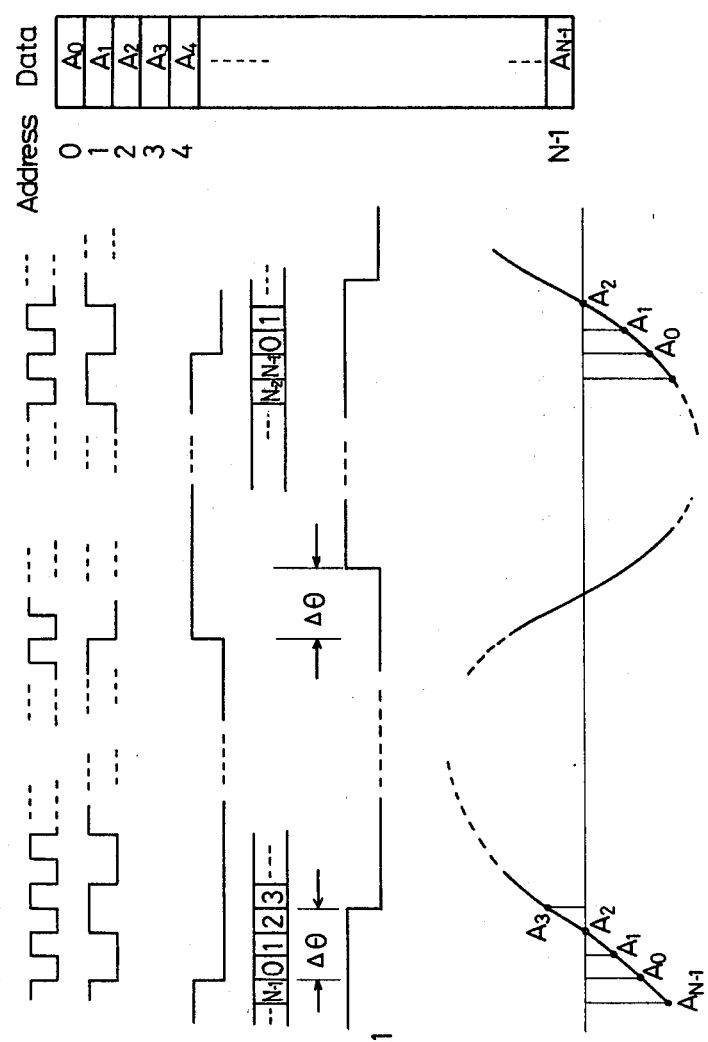
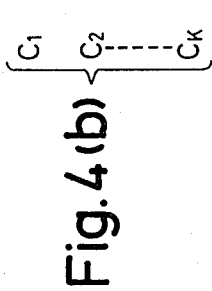

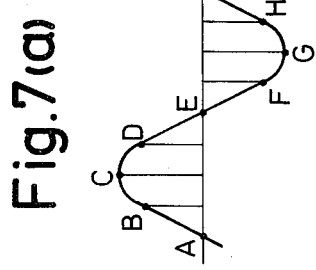

APPARATUS FOR MEASURING DISTORTION FACTOR

BACKGROUND OF THE INVENTION

The present invention relates to an apparatus for measuring a distortion factor of an analog input signal.

As is well known in the art a distortion factor $K(\%)$ is defined by the following equation;

$$K = \frac{\sqrt{\sum_{m=2}^{\infty} Em^2}}{E_1} \times 100 \ (\%)$$

wherein $E_1$ is an effective value of a fundamental wave of the input signal, and $Em$ is an effective value of an $M^{th}$ harmonic wave.

FIG. 1 is a circuit diagram showing a known apparatus for measuring a distortion factor. An input signal is supplied from an input terminal I to a switch $S_1$ through a first variable attenuator 1 and a buffer amplifier 2. The input signal is directly supplied by means of a switch $S_2$ to a second variable attenuator 4 and is supplied through a filter 3 which may be formed by, for example a twin T circuit or a Wien bridge for eliminating or suppressing a fundamental wave in the input signal to be measured. The signal is further supplied through an amplifier 5 to a level meter 6. The input signal is supplied from an oscillator through an amplifier or electronic circuit under test.

Upon measurement at first the switches $S_1$ and $S_2$ are connected to contacts 1 and the level of the input signal is measured. Then the switches $S_1$ and $S_2$ are shifted to contacts 2 and the fundamental component is removed from the input signal by means of the filter 3 and the level of harmonic waves is measured. Then the distortion factor can be obtained as a ratio between the two measured signal levels in accordance with the above mentioned equation.

Nowadays due to progress of semiconductor devices and circuit techniques properties of audio apparatuses have been improved to a great extent and these apparatuses have extremely high fidelity. Accordingly the apparatus for measuring distortion factors of such audio apparatuses should have a sufficiently high sensitivity for measuring a very small distortion factor such as 0.0003%. However, in order to measure such a low distortion factor by means of the known apparatuses, an operator would encounter the following difficulties.

(1) Since the fundamental wave should be removed from the input signal by the filter 3 to a great extent, it is quite difficult to construct the filter 3 which can be tuned to a desired resonance frequency with a given amount of attenuation. Usually the filter is composed of the twin T circuit or Wien bridge and is tuned to the desired frequency by adjusting a variable capacitor or resistor forming the bridge circuit. When an amount of component to be removed is increased, resonance characteristics should be very sharp and thus the amount of removed fundamental wave is limited to about 70 dB by means of manual adjustment. It is impossible to remove the fundamental component more than that, while the bridge circuit is kept in a balanced condition stably. If a plurality of filters are connected in cascade, an attenuation bandwidth will be widened and the tuning adjustment will be easy. However in such a case the capacitors and/or resistors of these filters have to be adjusted in conjunction with each other in a very accurate manner. Further the construction of the filter will be complicated and the cost will be increased.

(2) Noise which is produced in the distortion factor measuring apparatus should be negligible with respect to the distortion component in the input signal to be measured and could not be ignored. However, in the known apparatuses small distortion factors could not be measured with high accuracy due to the noise.

SUMMARY OF THE INVENTION

The present invention has for its object to provide a novel and useful apparatus for measuring a distortion factor of an input signal, in which a filter can be tuned to a fixed frequency which can be suitably predetermined in regardless with a frequency of the input signal and thus can be constructed simply and the distortion factor can be measured very accurately.

It is another object of the invention to provide an apparatus which can measure a distortion factor very accurately while removing the influence of noise.

According to the invention an apparatus for measuring a distortion factor of an analog input signal comprising means for receiving the input signal and multiplying its frequency to produce a sampling signal;

analog to digital converting means for receiving the input signal and converting its instantaneous values into digital values each time the sampling signal is supplied from the frequency multiplying means;

memory means for receiving the converted digital values and storing them at given address positions;

digital to analog converting means for reading out the digital values stored in said memory means in a correct phase sequence at a given frequency and converting the read out digital values into analog signals;

filter means for receiving the converted analog signals and selectively eliminating a given frequency component of the analog signals to produce an output signal; and metering means for receiving said output signal from the filter means and detecting a level of the output signal; whereby the distortion factor of the input signal is measured as a ratio between the detected level of the output signal and a fundamental level of the input signal.

BRIEF DESCRIPTION OF THE DRAWINGS

FIG. 1 is a block diagram showing a known distortion factor measuring apparatus;

FIG. 2 is a block diagram illustrating a principal construction of a distortion factor measuring apparatus according to the invention;

FIGS. 4(a) to 4(e) are waveforms showing an operation of the digital processing circuit of FIG. 3;

FIG. 5 is a diagram depicting the manner of storing digital data;

FIGS. 7(a) and 7(b) are waveforms for explaining the operation of the circuit shown in FIG. 6;

FIG. 8 is a diagram illustrating the manner of storing digital data;

FIG. 9 is a block diagram showing an embodiment of a noise reducing circuit according to the invention;

DESCRIPTION OF THE PREFERRED EMBODIMENTS

Figure 3:
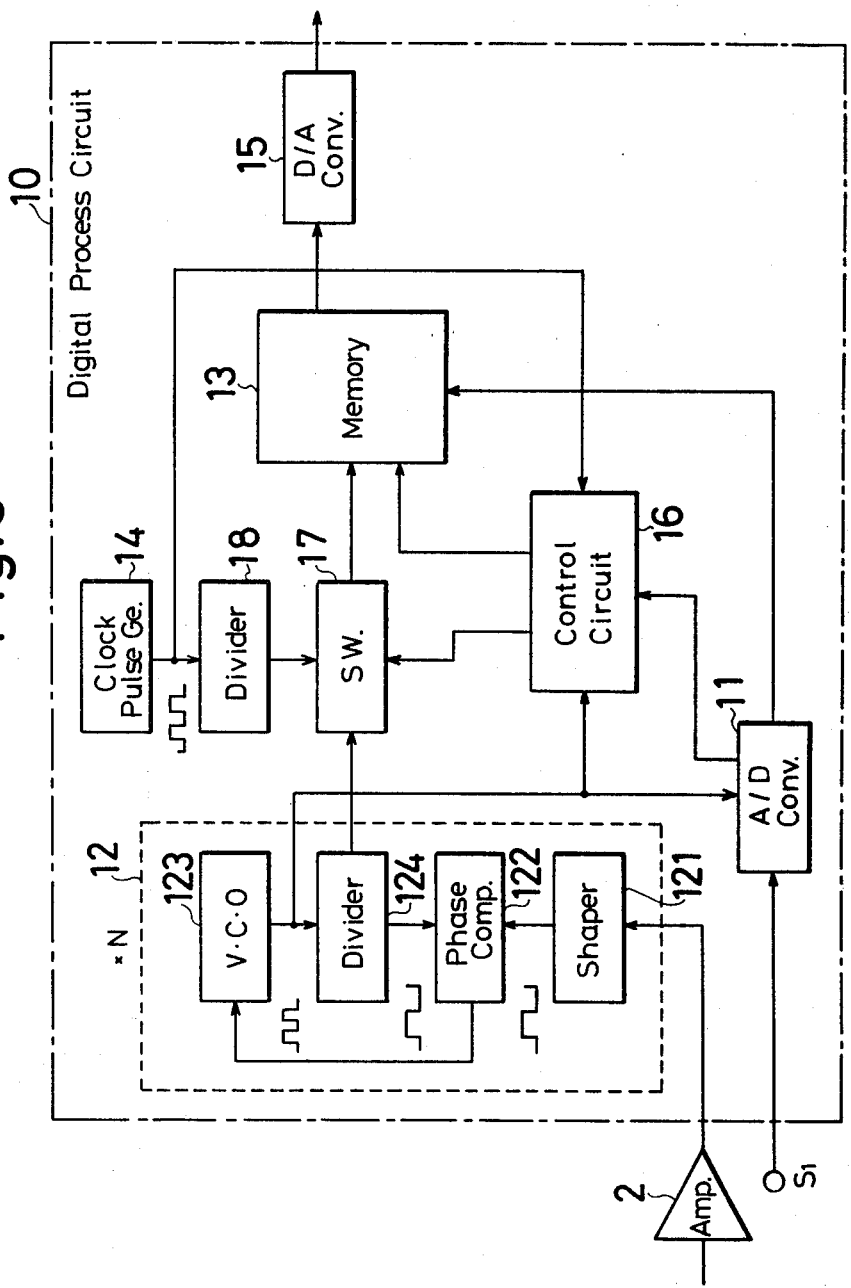
FIG. 3 is a block diagram showing an embodiment of a digital processing circuit of the apparatus according to the invention.

FIG. 2 is a block diagram showing a first embodiment of the distortion factor measuring apparatus according to the invention. In FIG. 2 a first variable attenuator 1, a buffer amplifier 2, a second variable attenuator 4, an amplifier 5, switches $S_1$ and $S_2$ and a level meter 6 are same as those of the known apparatus shown in FIG. 1 and are denoted by the same reference numerals. According to the invention a digital process circuit 10 and a filter 3a are connected between the buffer amplifier 2 and the second variable attenuator 4. The filter 3a has a fixed resonance frequency. In case of measuring a level of a fundamental wave, the switches $S_1$ and $S_2$ are connected to contacts 2. Then an input signal is supplied from an input terminal I to the digital process circuit 10 and an output from the circuit 10 is supplied to the second variable attenuator 4. In case of measuring a distortion component with removing the fundamental component, the switch $S_2$ is connected to a contact 3. Then the output from the digital process circuit 10 is supplied to the second variable attenuator 4 through the filter 3a. It is matter of course that the fundamental wave level may be measured by driving the switches $S_1$ and $S_2$ to connect to contacts 1. However, since it is preferable to make a measuring condition identical with that in measuring the distortion component, the digital process circuit 10 can be advantageously connected into circuit. In the digital process circuit 10 the output signal from the buffer amplifier 2 is supplied on one hand to an analog-digital converter 11 and on the other hand to a frequency multiplier 12 for multiplying the frequency of input signal by N times (N is a positive integer). An output signal from the multiplier 12 is supplied to the A/D converter 11 as a sampling signal and instantaneous values of the input signal are converted into digital amounts by the converter 11 in accordance with the sampling signal. The converted digital amounts are successively stored in a memory circuit 13. The stored digital amounts are successively read out by means of clock pulses supplied from a clock pulse generator 14 and having a given constant frequency. The read out digital amounts are then converted into analog signals by a digital-analog converter 15 including a low pass filter for removing noise and the converted analog signals are derived from the digital process circuit 10. The above mentioned operation is controlled by a control circuit 16. Upon receipt of a conversion end signal from the A/D converter 11, the control circuit 16 initiates the writing in operation into the memory circuit 13. Then the reading out from the memory circuit is initiated upon receipt of the clock pulses from the clock pulse generator 14 in an address order.

The operation of the digital process circuit 10 will be further explained in detail with reference to FIGS. 3 and 4 showing a detailed construction of the circuit 10 and a time chart, respectively. The sinusoidal input signal having the frequency fo is supplied to the A/D converter 11 and the frequency multiplier 12. In the multiplier 12 the input signal is first converted into a rectangular wave by a waveform shaper 121 and the rectangular wave is supplied to a phase comparator 122. An output signal from the phase comparator 122 is applied to a voltage controlled oscillator 123. The oscillator 123 produces a signal having a frequency N×fo as shown in FIG. 4(a). This signal is supplied to a frequency divider 124 comprising K flip-flop stages $C_1$, $C_2$ ... $C_K$ which produce output signals shown in FIG. 4(b). An output signal generated from the last stage $C_K$ is supplied to the phase comparator 122. The phase comparator 122 produces an output voltage which is proportional to a phase difference between the rectangular signal from the circuit 121 and the output from the stage $C_K$ of the frequency divider 124. The output voltge from the phase comparator 122 is so adjusted that the phase difference $\Delta\theta$ is always constant, i.e. the voltage controlled oscillator 123 can always produce the signal having the frequency of N×fo, even if the frequency of the input signal changes. This output signal from the oscillator 123 is supplied to the A/D converter 11 as the sampling signal and the input signal is converted into the digital amounts at the timing of the sampling signal and the converted digital amounts are successively supplied to the memory circuit 13 and are stored therein. Therefore, during one period of the input signal N instantaneous values thereof are converted into N digital values. The memory circuit 13 may be advantageously composed of a random access memory, but may be also constructed by a shift register. Upon effecting the writing-in operation into the memory circuit 13, the memory is addressed by the output count value signal from the frequency divider 124 via a switching circuit 17. That is to say, as shown in FIG. 4(e) instantaneous values $A_0$, $A_1$, $A_2$ ... $A_{N-1}$ of the input signal which are converted into digital values at timings when the frequency divider 124 produces the count values 0, 1, 2 ... N−1, respectively (FIG. 4(c)), are stored in the memory circuit 13 at corresponding address positions 0, 1, 2 ... N−1, respectively. These instantaneous values are successively stored in the memory circuit 13 as illustrated in FIG. 5. The clock pulses from the clock pulse generator 14 is supplied to a frequency divider 18 which has a similar circuit construction as that of the frequency divider 124 and is counted thereby. The count values are successively supplied to the memory circuit 13 as the address signals by means of the switching circuit 17 and the digital values stored at the corresponding address positions in the memory circuit 13 are successively read out under the control of the control circuit 16 each time the clock pulse is supplied to the control circuit. The read out digital signals are converted into the analog signals by the D/A converter 15. The output address signals from the frequency dividers 124 and 18 are supplied to the memory circuit 13 through the switching circuit 17. When the timings of writing-in and reading-out for the memory 13 become identical with each other, the control circuit 16 controls the switching circuit 17 in such a manner that the address signal from the frequency divider 18 is predominantly supplied to the memory circuit 13. In other words the reading-out operation has a priority with respect to the writing-in operation. Therefore the writing-in of the input data is delayed for a certain time until the predominant reading-out operation has been completed. By inserting the digital process circuit 10 in the distortion factor measuring apparatus, the input signal for one period is converted into N digital amounts and these digital amounts are successively stored in the memory circuit 13. Whilst, the digital amounts are read out of the memory circuit 13 at the rate of the clock pulses generated from the clock pulse generator 14 and thus from the D/A converter 15 there is produced the output analog signal having the given constant period in regardless to the frequency of the input signal. Therefore, the filter 3a is sufficient to have the given constant resonance frequency which is equal to the clock pulse frequency divided by N and it is not necessary to adjust the resonance frequency of the filter 3a in accordance with the frequency of the input signal.

The embodiment shown in FIG. 3 is preferably used for the input signal having a relatively low frequency. When the frequency of the input signal increases, there might be a fear that the conversion time of the A/D converter 11 could not follow the sampling period. It is true that there is an analog-digital converter of high speed and high resolution, but such a converter is quite expensive.

Figure 6:
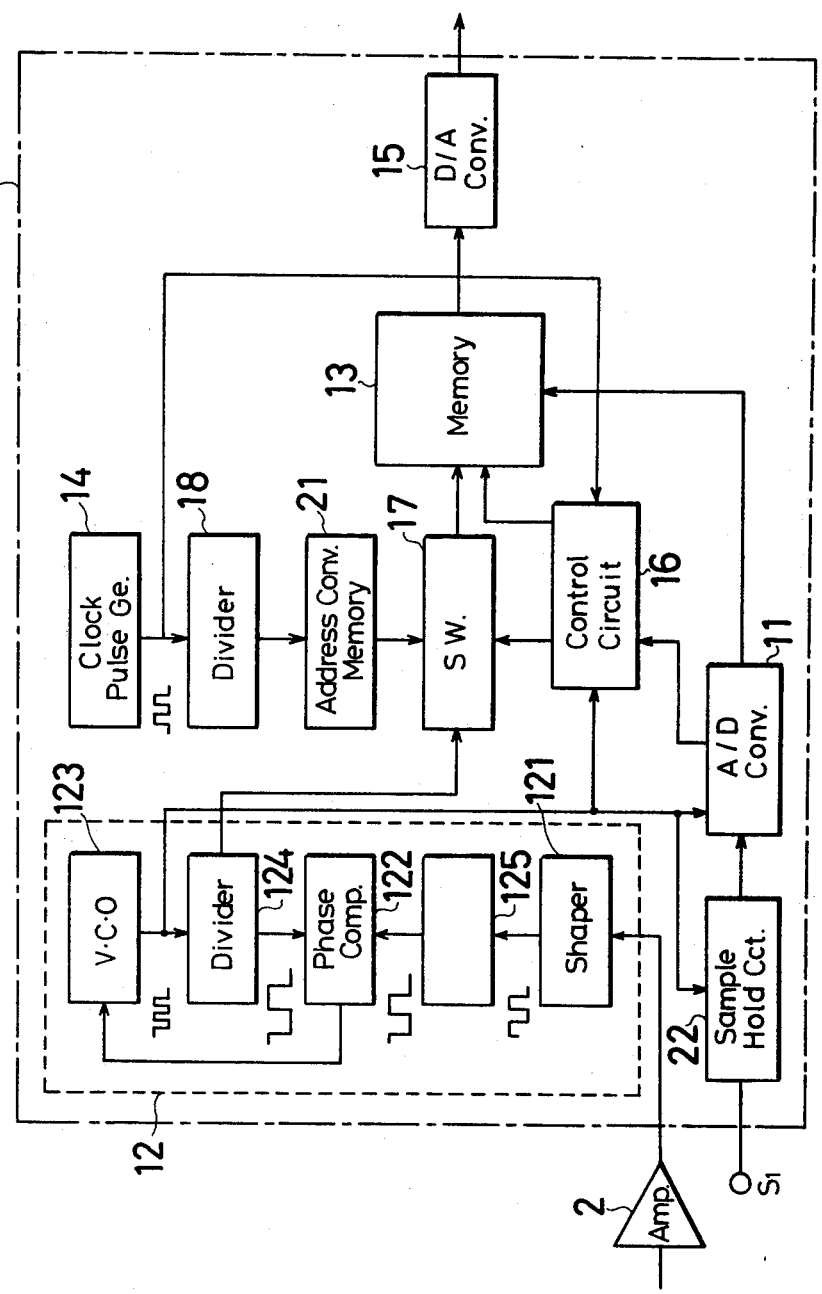
FIG. 6 is a block diagram showing another embodiment of the digital process circuit according to the invention.

FIG. 6 is a block diagram illustrating another embodiment of the digital process circuit which can treat the input signal having a higher frequency. As compared with the circuit 10 shown in FIG. 3, the digital process circuit 20 of this embodiment comprises a 1/L frequency divider 125 in the frequency multiplier 12, an address conversion memory circuit 21 succeeded by the frequency divider 18 and a sample-hold circuit 22 followed by the A/D converter 11. The 1/L frequency divider 125 is to complete the reading-in operation of a set of data within L periods of the input signal. The address conversion memory circuit 21 may be composed of a read only memory. In the present embodiment the conversion of the analog input signal into digital amounts could not be carried out in a correct phase sequence. However, the reading out should be effected in the correct phase sequence and the circuit 21 is provided for this purpose. The sample hold circuit 22 is a circuit for holding the input voltage to the A/D converter 11 constant even if the instantaneous value of the input signal varies quickly. For instance, if L is 3, a set of data can be stored in the memory during three periods of the input signal. When the conversion is effected in the correct phase sequence, the analog values A, B, C, D, E, F, G, H and A' will be successively converted into digital values as shown in FIG. 7(a). However, in the present embodiment the analog values A, D, G, B, E, H, C, F and A' are successively converted into digital values in this order at a given phase angle as illustrated in FIG. 7(b) and the converted digital values are successively stored in the memory circuit 13 with successive addresses as depicted in FIG. 8. Upon reading out the stored data from the memory circuit 13, the digital values A, B, C, D . . . have to be read out in this order. For this purpose the address conversion memory circuit 21 provides successively addresses 0, 3, 6, 1, 4, 7, 2, 5 . . . in this order. In this manner the digital amounts A, B, C, D . . . are successively read out and are converted into analog values by the D/A converter 15. In a modified embodiment the address conversion memory circuit 21 may be inserted in the output side of the frequency divider 124 and the writing in addresses may be converted in accordance with the sampling points. Then the reading out may be carried out in a normal address order. This address conversion may be further effected by a microprocessor and corresponding addresses may be calculated thereby.

FIG. 9 is a block diagram showing one embodiment of a noise reducing circuit 30 which is inserted between the A/D converter 11 and the memory circuit 13. This circuit 30 can reduce noise over a whole frequency range and thus the distortion factor can be accurately measured even if the input signal has a low level or the distortion factor itself is very small. The circuit 30 comprises a first digital calculating circuit 31 for multiplying the digital number supplied from the A/D converter 11, by $(1-K)$ times, wherein $0<K<1$. At the same time the digital number stored in the memory circuit at said address position is red out and is multiplied by K times in a second digital calculating circuit 32. The multiplied digital numbers from the first and second calculating circuits 31 and 32 are digitally summed by an adder 33 and a summed digital number is stored in the memory circuit 13 at said address position instead of the digital number which has just read out. Since the data of the input signal at the same phase position is stored in the same address position of the memory circuit 13, the input signal component at this point should be equal and thus after a number of samplings the input signal components are successively summed up and the stored data reaches a final value. During this procedure noise component might appear in a random manner and thus will be cancelled out gradually. A noise reduction ratio depends upon a value of K and improvement expressed $$10 \log_{10} \frac{(1+k)}{(1-k)} \text{ (dB)}$$

can be obtained.

The band suppressing filter 3a may be replaced by a high pass filter which passes a second harmonic wave frequency components higher than the second harmonic wave, but suppresses the fundamental wave and frequency components lower than the fundamental. In this case since noise lower than the fundamental frequency can be removed, any measuring error due to hum, flicker noise, etc. can be removed. Further a comb type filter for extracting selectively the fundamental wave and its harmonics may be connected to an output of the band suppressing filter 3a. Then noise in the input signal and generated in the measuring circuit can be removed.

Moreover when the band suppressing filter 3a is replaced by a band pass filter which may be tuned to a given desired harmonic frequency such as second harmonic frequency, third harmonic frequency and so on, an amplitude of any desired harmonic wave component can be measured and a harmonic analysis can be effected. In known harmonic analysis, it is required to provide a complicated and expensive apparatus such as a spectrum analyzer or to use a complicated and expensive filter which can be tuned to respective harmonic frequencies of the input signal having a frequency which may vary within a very wide frequency range. Contrary to this according to the present invention by providing the digital process circuit 10 or 20 it is entirely unnecessary to tune the resonance frequency of the filter in accordance with the input signal frequency, so that the filter can be simply realized. In this case when the band pass filter is of a voltage controlled type, the levels of different harmonics can be successively measured in a very simple manner by successively adjusting the control voltage. If the filtering characteristic of the band pass filter is not steep, the band pass filter may be combined with a fundamental wave suppressing filter.

Figure 10:
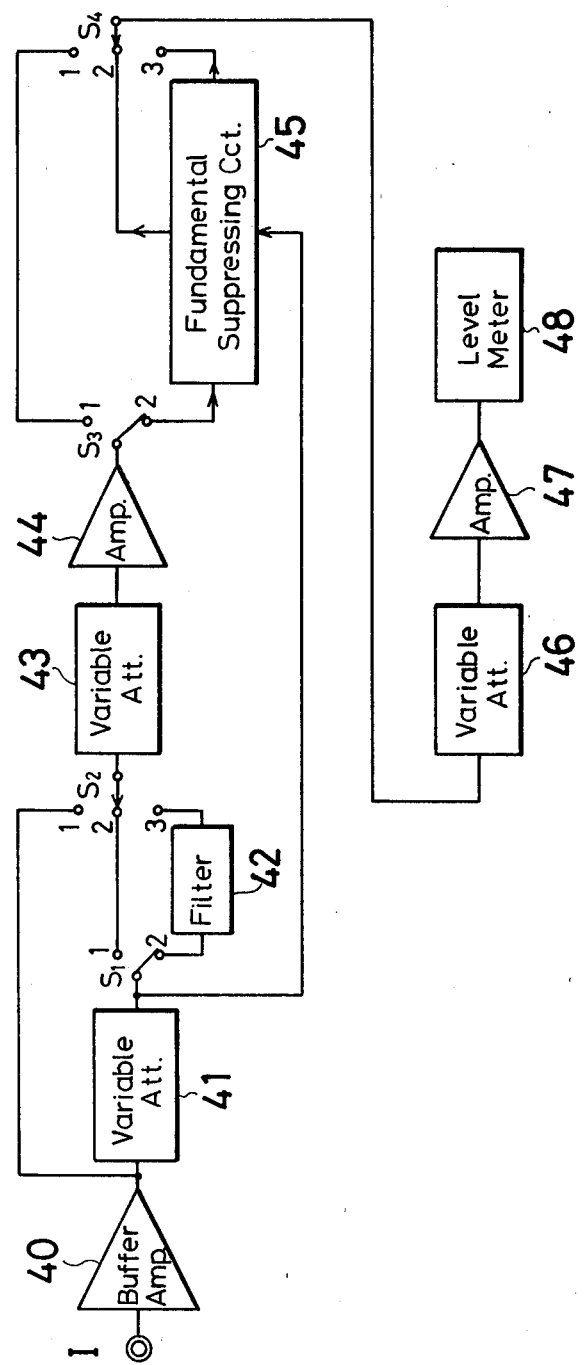
FIG. 10 is a block diagram illustrating another embodiment of the distortion factor measuring apparatus according to the invention.

FIG. 10 is a block diagram showing another embodiment of the distortion factor measuring apparatus according to the invention. An input signal is supplied from an input terminal I to a buffer amplifier 40 and a first variable attenuator 41. The input signal is further supplied through switchs $S_1$ and $S_2$ to an second variable attenuator 43 directly or through a first filter 42 for suppressing a fundamental frequency component of the input signal. The input signal is further supplied from the attenuator 43 to an amplifier 44. The input signal from the amplifier 44 is supplied through switches $S_3$ and $S_4$ to a third variable attenuator 46 directly or through a fundamental wave suppressing circuit 45. This fundamental wave suppressing circuit 45 is same as a combination of the digital process circuit 10 and the filter 3a shown in FIG. 2. The output signal from the third variable attenuator 46 is supplied through an amplifier 47 to a level meter 48. The first filter 42 may be formed by a twin T circuit having a variable capacitor or resistor by adjusting which manually or automatically the fundamental wave can be suppressed by 50 to 70 dB. The amount of suppression may be further increased by connecting a plurality of filters in cascade. On the other hand the digital process filter 45 can suppress the fundamental wave by about 60 to 70 dB and thus, the total amount of suppression may amount to 110 to 140 dB.

When the fundamental wave level is to be measured, the input signal is supplied through the contact 1 of the switch $S_1$, the contact 2 of the switch $S_2$, the contact 2 of the switch $S_3$, the fundamental wave suppressing circuit 45 and the contact 2 of the switch $S_4$ to the level meter 48. As shown in FIG. 2 the output signal from the D/A converter 15 is supplied to the contact 2 of the switch $S_2$. It should be noted that the contact 2 of the switch $S_2$ in FIG. 2 corresponds to the contact 2 of the switch $S_4$ in FIG. 10. On the other hand when the level of the harmonic waves is to be measured, the output signal from the circuit 45 is supplied through the contact 3 of switch $S_4$.

Now the distortion factor measurement can be carried out by means of the apparatus shown in FIG. 10 in the following manner.

(a) Input Level Calibration

The switches $S_1$, $S_2$, $S_3$ and $S_4$ are switched into the contacts 1, 2, 2 and 2, respectively and the input signal is passed through a part of the fundamental wave suppressing circuit 45 so as to effect the calibration for the input signal. The second and third variable attenuators 43 and 46 are adjusted to the maximum attenuation and then the first variable attenuator 41 is so adjusted that the level meter 48 indicates a full scale. In this manner gain of the measuring circuit can be calibrated for the level of the input signal.

(b) Measurement of Distortion Factor

The switches $S_1$, $S_2$, $S_3$ and $S_4$ are switched over into the contacts 2, 3, 2 and 3, respectively. The first variable attenuator 41 is remained at the condition which has been attained in the first calibrating step. Then the first filter 42 is so adjusted that its resonance frequency at which the attenuation is maximum becomes identical with the frequency of the input signal. By this measure the fundamental component in the input signal is sufficiently attenuated by the filter 42 and the fundamental wave suppressing circuit 45. Then the output signal from the circuit 45 contained only distortion component and has a small level. Therefore the level meter 48 indicates a very small value. Then attenuation amount of the second and third variable attenuators 43 and 46 are suitably reduced in such a manner that the meter 48 indicates a suitable value. Usually the attenuation amount may be decreased at a step of 10 dB. This adjustment may be carried out by the two variable attenuators in conjunction with each other and the meter 48 can indicate a readable value. The distortion factor can be obtained by the amount of attenuation of the second and third variable attenuators 43 and 46 and the indication of the level meter 48.

Next the measurement process will be explained with reference to numerical example. It is assumed that the attenuation of each of the second and third attenuators 43 and 46 may be varied from 0 to 60 dB, a gain of the respective amplifiers 44 and 47 is 60 dB and the meter indicates the full scale, when the input signal is 1 volt. Since the second and third attenuators 43 and 46 are adjusted to maximum attenuation of 60 dB in the calibraton step (a), when the input signal to the second variable attenuator 43 is adjusted to 1 volt by means of the first variable attenuator 41, the output signal from the amplifier 47, that is the input signal to the level meter 48 becomes 1 volt and the meter 48 indicates the full scale. Then the switches $S_1$ to $S_4$ are turned over in the positions in the measurement step (b). If the meter indicates a half of the full scale by adjusting the second variable attenuator 43 to 0 dB and the third variable attenuator 46 to 20 dB, the following equation can be obtained, wherein distortion D (dB) can be expressed by D (dB)=20 $\log_{10}$ K/100 (K is the distortion factor).

Distortion $D$ (dB) +
Amplification of Amplifier 44 (dB) +
Amplification of Amplifier 47 (dB)
− Attenuation of Attenuator 43 (dB)
− Attenuation of Attenuator 46 (dB)
= Indication of Meter 48 (dB).

Therefore, D+60+60−0−20=−6 is obtained and thus, D=−106. A distortion factor K of 0.0005% corresponding to the derived gain D can be calculated.

The apparatus shown in FIG. 10 may be modified in various manner. For instance, the first variable attenuator 41 may be automatically adjusted in accordance with the input signal so as to make its output constant. Then the calibration step (a) may be omitted. Further the level meter 48 may be of a ratio meter type. In this case the meter indicates the output from the amplifier 47 divided by the output from the buffer amplifier 40. Also in this modification the calibration step (a) may be omitted. Moreover the tuning operation of the first filter 42 may be carried out automatically by providing a circuit for measuring a frequency or period of the input signal. The buffer amplifier 40 is provided for making the input impedance of the measuring circuit high so as to reduce influence upon a circuit to be tested but may be deleted if the circuit to be tested has a sufficiently low output impedance. Then the measurement could not be affected by a possible distortion of the buffer amplifier 40 and a very accurate measuring result could be obtained. It should be noted that the digital process circuit 10 illustrated in FIG. 3 or the digital process circuit 20 in FIG. 6 may be equally used in the fundamental wave suppressing circuit 45. Further the slope characteristic of the filter 42 may be compensated for by arranging an equalizer circuit at the output of the D/A converter 15.

Figure 11C:
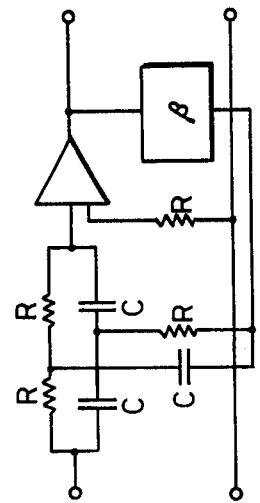
FIGS. 11(a), 11(b) and 11(c) are respectively: one embodiment of a circuit diagram of a first filter shown in FIG. 10, frequency characteristic curves and a circuit diagram of another embodiment of the first filter.
Figure 12B:
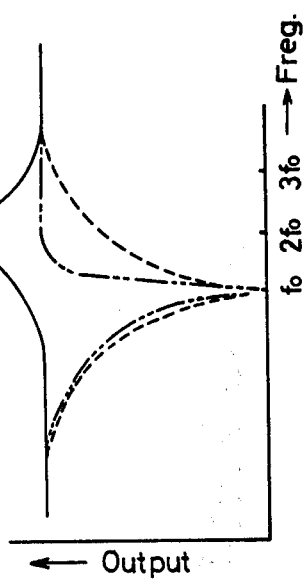
FIGS. 12(a) and 12(b) are a block diagram of an embodiment of the first filter and frequency characteristic curves; respectively.
Figure 11B:
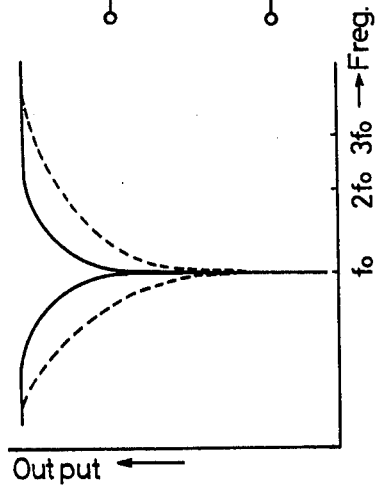
Figure 11A:
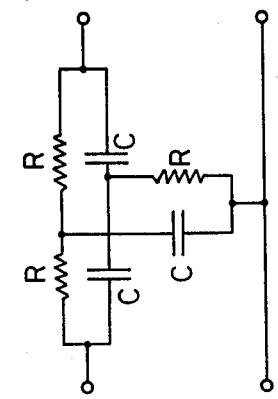
Figure 12A:
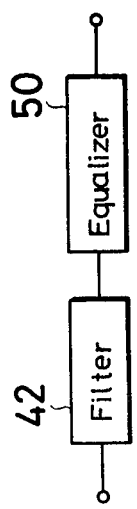

FIG. 11 (a) illustrates a circuit diagram of a twin T circuit which is used as the filter 42 and FIG. 11(b) shows its frequency characteristics. The usual filter shown in FIG. 11 (a) has a characteristic curve depicted by a broken line and slopes of the curve on both sides of a resonance frequency $f_0$ are relatively dull. Therefore second and third harmonics might be attenuated to a substantial extent and this results in a relatively large error in the distortion factor measurement. The characteristic curve can be improved as shown by a solid line by providing a feedback circuit as illustrated in FIG. 11(c). However when the characteristic is to be improved by the feedback, the circuit is liable to be unstable, could not remove the fundamental wave satisfactorily, and might produce large noise. Therefore it is preferable to constitute the filter 42 by the simple circuit without the feedback as illustrated in FIG. 11(a). Then the deterioration of the high frequency characteristics may be reduced by connecting an equalizing circuit 50 to the filter 3a connected to the output of the digital process circuit as shown in FIG. 12(a). The equalizing circuit 50 has a frequency characteristic as illustrated by a solid line in FIG. 12 (b). By combining the filter 42 having the characteristic shown by a broken line in FIG. 12 (b) with the equalizing circuit 50 having the characteristic shown by the solid line, a better characteristic shown by a chain line in FIG. 12(b) can be obtained. If such a compensating method is applied to the known apparatus, the frequency characteristic of the equalizing circuit 50 must be changed in accordance with the frequency of input signal and thus, the above method could hardly be realized. Contrary to this according to the present invention since the D/A converter 15 in the fundamental wave suppressing circuit 45 provides the output signal having the constant frequency in regardless to the input signal frequency, the frequency characteristic of the first filter 42 shown in FIG. 11 (a) can be effectively improved by providing the equalizing circuit 50 having the given frequency characteristic at the output side of the D/A converter 15.

In the embodiment shown in FIG. 10 the noise reduction circuit 30 illustrated in FIG. 9 can be also used and noise can be materially decreased over the whole frequency range.

Figure 13:
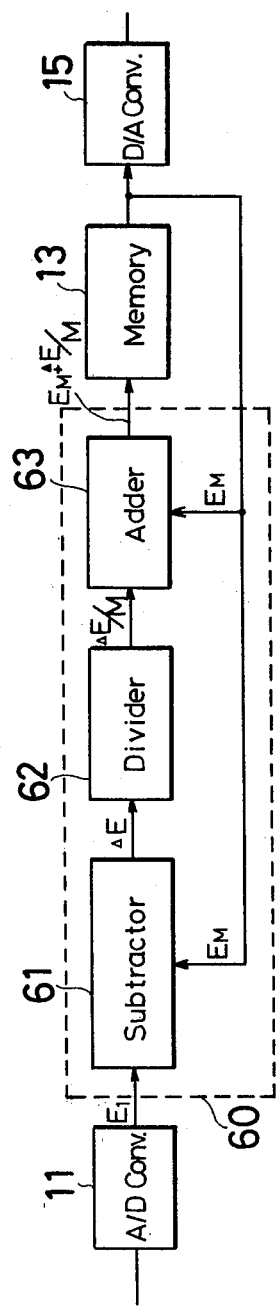
FIG. 13 is a block diagram showing another embodiment of the noise reducing circuit.

FIG. 13 shown another embodiment of the noise reduction circuit. This circuit 60 is connected between the A/D converter 11 and the memory circuit 13. It is assumed that a digital value at a certain sampling point of the input signal is Ei and the digital value which has been stored in the memory circuit 13 at the corresponding address point is Em. At first a difference $\Delta E$ between these values is calculated by a circuit 61 ($\Delta E = Ei - Em$). This difference $\Delta E$ represents a difference between the new data and the previously stored data and becomes zero when both data are correct. However at a start of sampling the value Em is usually different from the input data Ei, and even after the data stored in the memory circuit 13 has become stable the input data Ei will differ from the stored data Em, when the input signal includes noise. The difference $\Delta E$ is divided in a dividing circuit 61 by M ($M = 2^J$: J is positive integer) and a quotient is arithmetically added to the value Em in an adder 63. The sum from the adder 63 is stored in the memory circuit 13 at the latest data. In this maner the digital values stored in the memory circuit 13 becomes closer to the input signal after several cycles of the input signal. After that, noise in the input signal will affect the stored data only by 1/M. By suitably selecting the integer M, it is possible to obtain the input signal data with reduced noise.

Figure 14B:
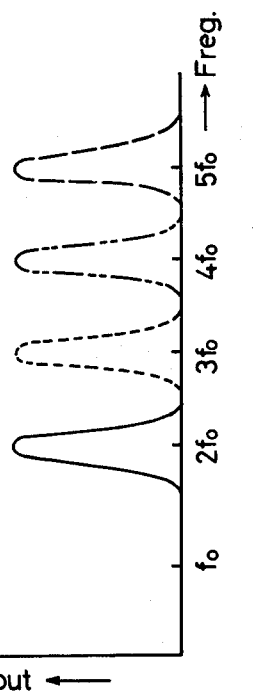
FIGS. 14(a) and 14(b) are a block diagram showing another embodiment of the apparatus according to the invention and waveforms for explaining its operation.
Figure 14A:
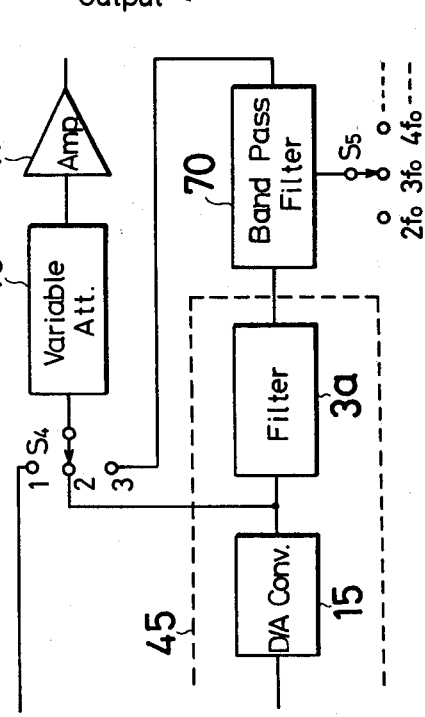

FIG. 14(a) is a circuit for measuring the amount of a given harmonic component by connecting a band pass filter 70 between the filter 3a for removing the fundamental wave and the switch $S_4$. That is to say this circuit can effect the harmonic analysis. By operating a switch $S_5$ the band pass filter 70 is tuned to any desired harmonic such as second harmonic frequency 2f0, third harmonic frequency 3f0, etc. as shown in FIG. 14(b), the amplitude of the desired harmonic component can be selectively measured. In this embodiment the resonance frequency can be selected by changing a filter constant by means of the switch $S_5$. This may be alternatively effected by connecting any desired one of a plurality of band pass filters having different resonance frequencies. Further the band pass filter may be of a voltage controlled type and the resonance frequency may be suitably set by adjusting a control voltage in a stepwise manner.

What is claimed is:
1. An apparatus for measuring a distortion factor of an analog input signal comprising:
  means for receiving the input signal and multiplying its frequency to produce a sampling signal;
  analog to digital converting means for receiving the input signal and converting its instantaneous values into digital values each time the sampling signal is supplied from the frequency multiplying means;
  memory means for receiving the converted digital values and storing them at given address positions;
  means for controlling the writing and reading operation for the memory means;
  means for reading the ditital values stored in the memory means with a given time interval;
  digital to analog converting means converting the read out digital values into analog signals;
  filter means for receiving the converted analog signals and selectively eliminating a given frequency component of the analog signals to produce an output signal;
  metering means for receiving said output signal from the filter means and detecting a level of the output signal; and
  means for calibrating the gain of the metering means in accordance with the input signal level whereby the distortion factor of the input signal is measured as a ratio between the detected level of the output signal and a fundamental level of the input signal.
2. An apparatus according to claim 1, wherein said filter means comprises a band suppressing filter which selectively eliminates a fundamental frequency component of the input signal.

3. An apparatus according to claim 1, wherein said filter means comprises a high pass filter which selectively passes a second harmonic wave and frequency components higher than the second harmonic wave and selectively suppresses a fundamental component and frequency components lower than the fundamental wave.

4. An apparatus according to claim 1, wherein said filter means comprises a band pass filter which selectively passes a given harmonic wave and the amount of the given harmonic wave is measured.

5. An apparatus according to claim 4, wherein said band pass filter is a variable type which can be successively tuned to a plurality of harmonic waves so as to effect a hamonic analysis.

6. An apparatus according to claim 1, further comprising a switch having a switching arm connected to the metering means and first and second contacts connected to input and output terminals of the filter means, respectively, whereby when the fundamental level is measured, the switching arm is brought in contact with the first contact so as to supply the converted analog signals to the metering means, and when the level of the given frequency component is measured, the switching arm is brought into contact with the second contact to which is supplied the signal having the fundamental wave removed therefrom.

7. An apparatus according to claim 1, wherein said frequency multiplying means comprises
- a wave-form shaper for converting the input signal into a rectangular signal;
- a voltage controlled oscillator for generating the sampling signal;
- a frequency divider for dividing the sampling signal by an integer N; and
- a phase comparator for detecting a phase difference between the rectangular signal from the waveform shaper and the signal supplied from the frequency divider, whereby a signal proportional to the phase difference is applied to the voltage controlled oscillator as a control voltage so that the sampling signal has the frequency which is always equal to the frequency of the input signal multiplied by said integer N.

8. An apparatus according to claim 7, wherein said filter means has a resonace frequency which is equal to the reading out frequency divided by said integer N.

9. An apparatus according to claim 1, further comprising a sample hold circuit connected to an input of the analog to digital converting means.

10. An apparatus according to claim 9, wherein said multiplying means produces the sampling signal having such a frequency that the given number of the digital values are obtained for a plurality of periods of the input signal and said controlling means comprises an address conversion memory circuit for converting reading-out addresses in such a manner that the digital values are read out in the correct phase sequence.

11. An apparatus according to claim 1, further comprising a circuit for reducing noise connected between the analog to digital converting means and the memory means.

12. An apparatus according to claim 11, wherein said noise reducing circuit comprises a first digital calculating circuit for multipling the digital value supplied from the analog to digital converting means by $(1-K)$ times $(0<K<1)$, a second digital calculating circuit for multiplying the corresponding digital value stored in the memory means by K times, and an adder for adding the two multiplied digital values to produce a new digital value to be stored in the memory means.

13. An apparatus according to claim 11, wherein said noise reducing circuit comprises a circuit for subtracting the digital value supplied from the analog to digital converting means by the corresponding digital value stored in the memory means to produce a difference therebetween, a circuit for dividing the difference by M (M being a positive integer) to produce a quotient and a circuit for adding the quotient to the said corresponding digital value to produce a new digital value to be stored in the memory means.

14. An apparatus according to claim 1, further comprising a filter connected to an input of the analog to digital converting means for suppressing the fundamental component of the input signal.

15. An apparatus according to claim 14, wherein said filter comprises a twin T circuit tuned to a frequency of the fundamental component.

16. An apparatus according to claim 14, wherein said filter comprises a Wien bridge tuned to a frequency of the fundamental component.

17. An apparatus according to claim 14, further comprising an equalizing circuit connected to an output of the digital to analog converting means for improving a frequency characteristic of the filter, whereby an amount of reduction is decreased for harmonic components.

18. An apparatus according to claim 14, wherein said filter means comprises a band suppressing filter which selectively removes a fundamental frequency component of the input signal.

19. An apparatus according to claim 14, wherein said filter means comprises a high pass filter which selectively passes a second harmonic wave and frequency components higher than the second harmonic wave and selectively suppresses a fundamental wave and frequency components, lower than the fundamental wave.

20. An apparatus according to claim 14, wherein said filter means comprises a band pass filter which selectively passes a given harmonic wave and the amount of the given harmonic wave is measured.

21. An apparatus according to claim 20, wherein said band pass filter is a variable type which can be successively tuned to a plurality of harmonic waves so as to effect a harmonic analysis.

22. An apparatus according to claim 14, further comprising a switch having a switching arm connected to the metering means and first and second contacts connected to input and output of the filter means, respectively, whereby when the fundamental level is measured, the switching arm is brought in contact with the first contact so as to supply the converted analog signal to the metering means, and when the level of the given frequency component is measured, the switching arm is brought into contact with the second contact to which is supplied the signal having the fundamental wave removed therefrom.

23. An apparatus according to claim 14, wherein said frequency multiplying means comprises
- a waveform shaper for converting the input signal into a rectangular signal;
- a voltage controlled oscillator for generating the sampling signal;
- a frequency divider for dividing the sampling signal by an integer N; and a phase comparator for detecting a phase difference between the rectangular signal from the waveform shaper and the signal supplied from the frequency divider, whereby a signal proportional to the phase difference is applied to the voltage controlled oscillator as a control voltage so that the sampling signal has the frequency which is always equal to the frequency of the input signal multiplied by said integer N.

24. An apparatus according to claim 23, wherein said filter means has a resonance frequency which is equal to the reading-out frequency divided by said integer N.

25. An apparatus according to claim 14, further comprising a sample hold circuit connected to an input of the analog to digital converting means.

26. An apparatus according to claim 25, wherein said multiplying means produces the sampling signal having such a frequency that the given number of the digital values are obtained for a plurality of periods of the input signal and said controlling means comprises an address conversion memory circuit for converting reading-out addresses in such a manner that the digital values are read out in the correct phase sequence.

27. An apparatus according to claim 14, further comprising a circuit for reducing noise connected between the analog to digital converting means and the memory means.

28. An apparatus according to claim 27, wherein said noise reducing circuit comprises a first digital calculating circuit for multiplying the digital value supplied from the analog to digital converting means by $(1-K)$ times $(0<K<1)$, a second digital calculating circuit for multiplying the corresponding digital value stored in the memory means by K times and an adder for adding the two multiplied digital values to produce a new digital value to be stored in the memory means.

29. An apparatus according to claim 27, wherein said noise reducing circuit comprises a circuit for subtracting the digital value supplied from the analog to digital converting means by the corresponding digital value stored in the memory means to produce a difference therebetween, a circuit for dividing the difference by M (M being a positive integer) to produce a quotient and a circuit for adding the quotient to said corresponding digital value to produce a new digital value to be stored in the memory means.

* * * * *